(12) United States Patent
Liu et al.

(10) Patent No.: US 11,201,124 B2
(45) Date of Patent: Dec. 14, 2021

(54) SEMICONDUCTOR DEVICES, SEMICONDUCTOR WAFERS, AND METHODS OF MANUFACTURING THE SAME

(71) Applicant: OMNIVISION TECHNOLOGIES, INC., Santa Clara, CA (US)

(72) Inventors: Chia-Ying Liu, Hsinchu (TW); Wu-Zang Yang, Changhua County (TW); Chia-Jung Liu, Hsinchu (TW); Chi-Chih Huang, Taoyuan (TW)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 86 days.

(21) Appl. No.: 16/524,774

(22) Filed: Jul. 29, 2019

(65) Prior Publication Data

US 2021/0035926 A1 Feb. 4, 2021

(51) Int. Cl.
*H01L 21/762* (2006.01)
*H01L 21/78* (2006.01)
*H01L 23/58* (2006.01)
*H01L 27/146* (2006.01)
*H01L 23/00* (2006.01)

(52) U.S. Cl.
CPC ...... *H01L 23/585* (2013.01); *H01L 21/76224* (2013.01); *H01L 23/562* (2013.01); *H01L 27/1463* (2013.01)

(58) Field of Classification Search
CPC ......... H01L 23/585; H01L 23/562–576; H01L 21/76; H01L 21/76224; H01L 21/76229; H01L 21/823481; H01L 21/823878; H01L 27/1463; H01L 21/78
See application file for complete search history.

(56) References Cited

U.S. PATENT DOCUMENTS

| | | | |
|---|---|---|---|
| 8,338,917 B2* | 12/2012 | Yaung | H01L 21/78 257/620 |
| 8,466,010 B2 | 6/2013 | Tai et al. | |
| 9,293,495 B2 | 3/2016 | Borthakur et al. | |
| 9,431,452 B1* | 8/2016 | Liu | H01L 27/14627 |
| 9,443,899 B1* | 9/2016 | Liu | H01L 27/14609 |
| 9,659,989 B1* | 5/2017 | Ai | H01L 21/76237 |
| 9,773,829 B2* | 9/2017 | Zheng | H01L 27/1469 |
| 9,923,009 B1* | 3/2018 | Hsiung | H01L 27/14629 |
| 10,181,490 B2* | 1/2019 | Watanabe | H01L 27/14683 |
| 10,432,883 B1* | 10/2019 | Chapman | H01L 27/14623 |
| 10,535,702 B1* | 1/2020 | Hsieh | H01L 27/1463 |
| 10,672,934 B2* | 6/2020 | Wang | H01L 31/107 |
| 10,790,322 B1* | 9/2020 | Wang | H01L 27/1463 |

(Continued)

*Primary Examiner* — Maliheh Malek

(74) *Attorney, Agent, or Firm* — Muncy, Geissler, Olds & Lowe, P.C.

(57) ABSTRACT

The present disclosure provides a semiconductor device. The semiconductor device includes a semiconductor substrate and a first deep trench isolation (DTI) structure filled with a dielectric material formed on the semiconductor substrate. The first DTI structure is disposed in the first seal ring region and is extended into the semiconductor substrate. The semiconductor substrate has a pixel array region and a first seal ring region. The first seal ring region is proximate to an edge of the semiconductor substrate and surrounds the pixel array region. The first DTI structure is formed in the first seal ring region and surrounds the pixel array region.

16 Claims, 11 Drawing Sheets

(56) References Cited

U.S. PATENT DOCUMENTS

| | | | | |
|---|---|---|---|---|
| 10,811,453 B1* | 10/2020 | Mun | | H01L 27/14627 |
| 2005/0184353 A1* | 8/2005 | Mouli | | H01L 27/1463 |
| | | | | 257/446 |
| 2014/0239362 A1* | 8/2014 | Koo | | H01L 27/1464 |
| | | | | 257/294 |
| 2015/0236058 A1* | 8/2015 | Hu | | H01L 27/14612 |
| | | | | 250/208.1 |
| 2015/0270333 A1* | 9/2015 | Yang | | H01L 29/36 |
| | | | | 257/337 |
| 2015/0340391 A1* | 11/2015 | Webster | | H01L 27/14621 |
| | | | | 348/322 |
| 2015/0372031 A1* | 12/2015 | Yoon | | H01L 27/14689 |
| | | | | 257/446 |
| 2016/0021322 A1* | 1/2016 | Jung | | H04N 5/3532 |
| | | | | 250/208.1 |
| 2016/0043120 A1* | 2/2016 | Ahn | | H01L 27/14614 |
| | | | | 257/229 |
| 2016/0056200 A1* | 2/2016 | Lee | | H01L 27/1464 |
| | | | | 250/208.1 |
| 2016/0099266 A1* | 4/2016 | Zheng | | H01L 27/14685 |
| | | | | 250/208.1 |
| 2016/0099278 A1* | 4/2016 | Guyader | | H01L 27/1463 |
| | | | | 257/432 |
| 2016/0225813 A1* | 8/2016 | Liao | | H01L 27/14623 |
| 2016/0268220 A1* | 9/2016 | Tsai | | H01L 27/14689 |
| 2016/0276394 A1* | 9/2016 | Chou | | H01L 27/14621 |
| 2016/0307952 A1* | 10/2016 | Huang | | H01L 27/14636 |
| 2017/0077157 A1* | 3/2017 | Cheng | | H01L 27/14621 |
| 2017/0104020 A1* | 4/2017 | Lee | | H01L 27/1463 |
| 2017/0117309 A1* | 4/2017 | Chen | | H01L 27/14643 |
| 2017/0170229 A1* | 6/2017 | Oh | | H01L 27/14621 |
| 2017/0186732 A1* | 6/2017 | Chu | | H01L 21/76898 |
| 2017/0287975 A1* | 10/2017 | Koo | | H01L 27/14689 |
| 2017/0330905 A1* | 11/2017 | Tak | | H01L 27/14621 |
| 2017/0330906 A1* | 11/2017 | Korobov | | H01L 27/14641 |
| 2017/0345851 A1* | 11/2017 | Yang | | H01L 27/1461 |
| 2017/0365631 A1* | 12/2017 | Iizuka | | H01L 27/14636 |
| 2018/0151615 A1* | 5/2018 | Wen | | H01L 27/14623 |
| 2018/0151759 A1* | 5/2018 | Huang | | H01L 31/0232 |
| 2018/0166477 A1* | 6/2018 | Raynor | | H01L 27/14621 |
| 2018/0182806 A1* | 6/2018 | Jin | | G02B 27/1013 |
| 2018/0197950 A1* | 7/2018 | Natsume | | H01L 21/8222 |
| 2018/0286897 A1* | 10/2018 | Watanabe | | H01L 27/14627 |
| 2018/0337211 A1* | 11/2018 | Su | | H01L 27/1462 |
| 2019/0131349 A1* | 5/2019 | Im | | H01L 27/14665 |
| 2019/0165009 A1* | 5/2019 | Wu | | H01L 27/14612 |
| 2019/0165026 A1* | 5/2019 | Kuo | | H01L 27/1462 |
| 2019/0198453 A1* | 6/2019 | Sekikawa | | H01L 23/562 |
| 2019/0363079 A1* | 11/2019 | Thei | | H01L 23/585 |
| 2020/0006410 A1* | 1/2020 | Wu | | H01L 27/14629 |
| 2020/0075662 A1* | 3/2020 | Huang | | H01L 27/14643 |
| 2020/0098798 A1* | 3/2020 | Takahashi | | H01L 27/14603 |
| 2020/0105812 A1* | 4/2020 | Sze | | H01L 27/1463 |
| 2020/0111821 A1* | 4/2020 | Hong | | H01L 27/14685 |
| 2020/0135776 A1* | 4/2020 | Finkelstein | | G01S 17/08 |
| 2020/0135789 A1* | 4/2020 | Cheng | | H01L 23/562 |
| 2020/0135792 A1* | 4/2020 | Wu | | H01L 27/14607 |
| 2020/0176492 A1* | 6/2020 | Huang | | H01L 27/14605 |
| 2020/0343281 A1* | 10/2020 | Wu | | H04N 5/3696 |
| 2021/0029311 A1* | 1/2021 | Webster | | H04N 5/3559 |
| 2021/0092315 A1* | 3/2021 | Seo | | H01L 27/0222 |

* cited by examiner

SEMICONDUCTOR DEVICES, SEMICONDUCTOR WAFERS, AND METHODS OF MANUFACTURING THE SAME

BACKGROUND

During dicing or singulation operation performed on a wafer (by for example a sawing or cutting technique, which may include laser, diamond saw, or other suitable technique(s)). Seal rings may be introduced in an outer region adjacent to a periphery or edge of each die or chip surrounding an active region of each die or chip, to protect the circuitry formed in the active region from damage or crack as a result of the singulation or dicing operation.

However, the seal rings might not be able to effectively stop damage or crack from propagating into the active region of each die/chip.

SUMMARY

In some embodiments, the present disclosure provides a semiconductor device. The semiconductor device includes a semiconductor substrate, and a first deep trench isolation (DTI) structure filled with a dielectric material and extended into the semiconductor substrate. The semiconductor substrate has a pixel array region and a first seal ring region. The first seal ring region is proximate to an edge of the semiconductor substrate and surrounds the pixel array region. The first DTI structure surrounds the pixel array region.

In some embodiments, the semiconductor device may further includes a first seal ring, which is formed in the first seal ring region. The first seal ring disposed proximate to an edge of the semiconductor substrate, and the first seal ring is vertically separated from the first DTI by a distance.

In one embodiment, the first seal ring and the first DTI are separated by at least a layer of dielectric.

In some embodiments, the present disclosure provides a semiconductor device. The semiconductor device includes a semiconductor substrate, and a plurality of first deep trench isolation (DTI) structures filled with a dielectric material. Each of the plurality of first DTI structures extends into the semiconductor substrate. The semiconductor substrate has a pixel array region and a first seal ring region. The first seal ring region is proximate to an edge of the semiconductor substrate and surrounds the pixel array region. The plurality of first DTI structure surrounds the pixel array region.

In some embodiments, the present disclosure provides a semiconductor wafer. The semiconductor wafer includes at least one of the semiconductor device as described above, and a scribe line region surrounding the at least one of semiconductor device.

In some embodiments, the present disclosure provides a method for manufacturing a semiconductor device. The method includes providing a semiconductor substrate having a first surface and a second surface. The method further includes forming a number of seal rings on the first surface of the semiconductor substrate. The method further includes forming a number of first DTI structures from the second surface of the semiconductor substrate to correspond to the seal ring.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
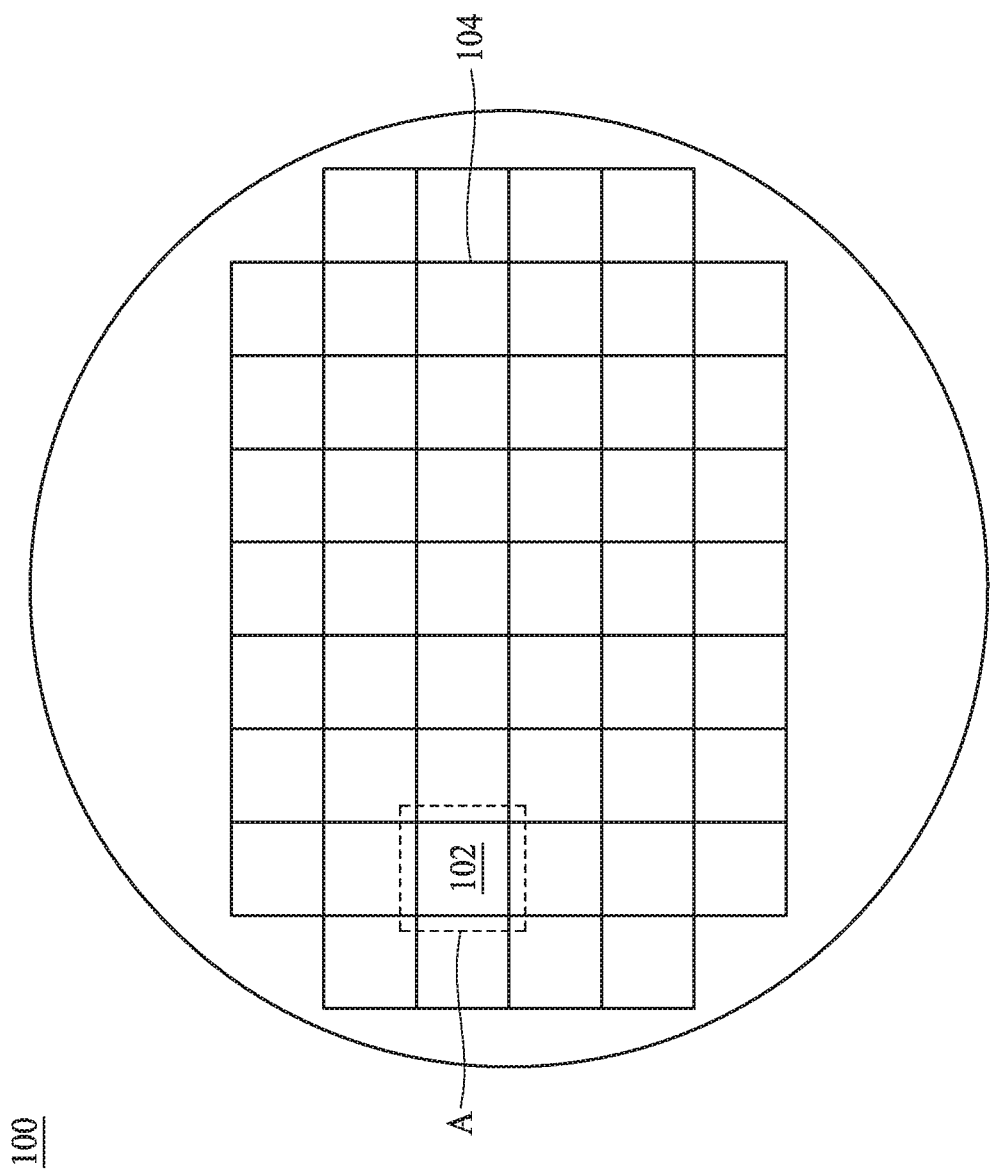
FIG. 1 illustrates a plan view of a semiconductor wafer in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference throughout this specification to "an example" or "an embodiment" means that a feature, structure, or characteristic described in connection with the example is included in at least one example of the present invention. Thus, the appearances of the phrases "in an example" or "in an embodiment" in various places throughout this specification are not necessarily all referring to the same example or embodiment. Furthermore, the features, structures, or characteristics may be combined in any suitable manner in one or more examples.

The term "have", "may have", "include", "may include" or "comprise" used herein indicates the existence of a corresponding feature (e.g., a number, a function, an operation, or an element) and does not exclude the existence of an additional feature.

Terms such as "first", "second", and "third" or the like are used in this specification to avoid confusion among components and do not set or limit the order or and/or priority. For example, without departing the scope of the present disclosure, a first element may be referred to as a second element and vice versa.

The terminology used herein is not for delimiting the present disclosure, but is for describing specific exemplary embodiments. The terms of a singular form may include plural forms unless otherwise specified. The terms used herein, including technical or scientific terms, have the same meanings as would be understood by those skilled in the art. Commonly-used terms defined in a dictionary may be interpreted as having meanings that are the same as or similar to contextual meanings defined in the related art, and should not be interpreted in an idealized or overly formal sense unless otherwise defined explicitly. Depending on cases, even the terms defined herein should not be such interpreted as to exclude the exemplary embodiments of the present disclosure.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a plan view of a semiconductor wafer 100 in accordance with some embodiments of the present disclosure.

The semiconductor wafer 100 may include a semiconductor substrate (not denoted in FIG. 1). The semiconductor substrate may include, for example but is not limited to, silicon, germanium, or other semiconductor material(s). The semiconductor substrate may be doped with impurities. In one embodiment, the semiconductor substrate may be a silicon substrate doped with p-type dopants, for example but is not limited to, boron. In another example, the semiconductor substrate may be a silicon substrate doped with an n-type dopants, for example but is not limited to, phosphorous or arsenic.

The semiconductor wafer 100 may include one or more dies or semiconductor devices 102 formed thereon. The semiconductor wafer 100 may have scribe lines 104 surrounding the semiconductor device 102. Each of the scribe lines 104 may have a scribe-line width, for example between 50 micrometers (μm) and 130 μm. Each of the scribe lines 104 may have a scribe-line depth, which is for example between 2 μm and 3 μm. Without departing from the scope hereof, the semiconductor wafer 100 may not include scribe lines 104, or have scribe-lines 104 with zero depth. The scribe lines 104 may in some embodiments be referred to as scribe regions 104 or scribe line regions 104.

The semiconductor device 102 can include, for example but is not limited to, a backside illuminated (BSI) die or a backside illuminated (BSI) image sensor.

The scribe lines 104 may enclose the semiconductor device 102. The scribe lines 104 can separate one semiconductor device 102 from another. The scribe line 104 can be disposed or formed adjacent to an edge or periphery of the semiconductor device 102.

Singulation or dicing operation can be performed along the scribe lines 104. For example, a diamond sawing or cutting technique may be applied along the scribe lines 104 to separate or divide the semiconductor wafer 100 into one or more individual dies or semiconductor devices 102.

Figure 2:
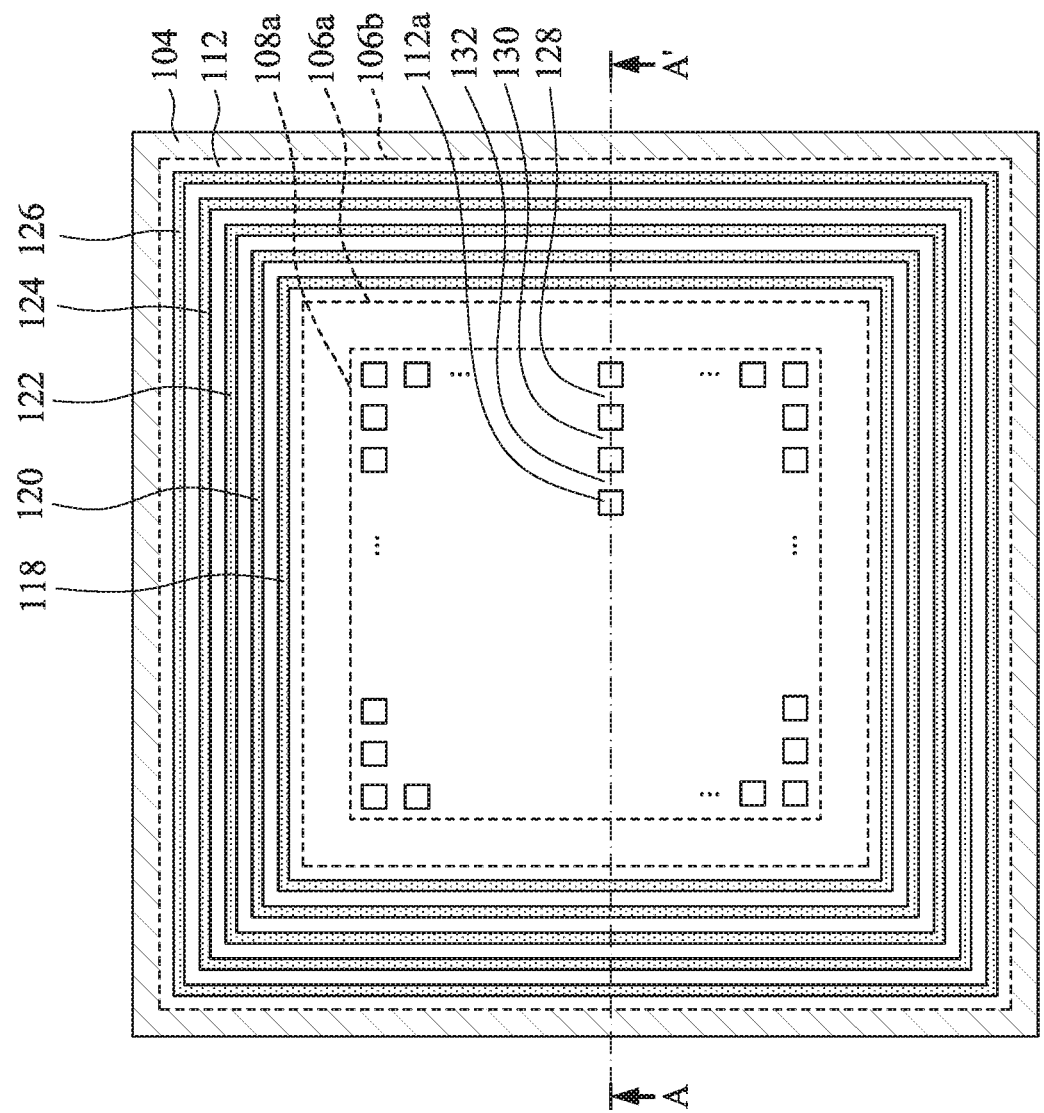
FIG. 2 illustrates an enlarged top view of a portion in a dotted box A as shown in FIG. 1 in accordance with some embodiments of the present disclosure.

FIG. 2 illustrates an enlarged top view of a portion in a dotted box A as shown in FIG. 1 in accordance with some embodiments of the present disclosure.

Referring to FIG. 2, the semiconductor device 102 (not denoted in FIG. 2) may be formed within the region enclosed by the dotted line 106b. The semiconductor device 102 may include a semiconductor substrate 112.

The semiconductor substrate 112 has a pixel array region, an outer seal ring region (or a first seal ring region), and an inner seal ring region (or a second seal ring region) defined thereon. For example, the pixel array region may be defined as the region enclosed by the dotted line 108a. The inner seal ring region may be defined as the region between the dotted line 108a and the dotted line 106a. The outer seal ring region may be defined as the region between the dotted line 106a and the dotted line 106b.

The pixel array region defined on the semiconductor substrate 112 may include one or more pixel regions 112a. The one or more pixel regions 112 may be formed in an array formed and spaced apart by a pitch. The pitch in one example may be 2.1 μm. The one or more pixel regions 112a may be formed within the region enclosed by the dotted line 108a. The region enclosed by the dotted line 108a may lie or may be defined within the region enclosed by the dotted line 106a. The region enclosed by the dotted line 106a can be relatively great in size in comparison with the region enclosed by the dotted line 108a. In other words, the area of the region enclosed by the dotted line 106a on the semiconductor substrate 112 is greater than area of the region enclosed by the dotted line 106b. In order to not obscuring the present invention, details on some well-known pixel elements, such as photodiode regions, transfer transistors, floating diffusion regions, source followers, the reset transistors, bit lines, control and read out circuitries and the like, are omitted from figure for clarity.

Each pixel region 112a may include a photo-sensor or detector structure for generating image signal in response to incident light. In one example, the pixel array region may include a plurality of deep trench isolation (DTI) structures formed on the semiconductor substrate 112, such as DTI structures 128, 130, 132 (with greater details provided later), for providing isolation between adjacent one or more pixel regions 112a. The plurality of DTI structures, such as DTI structures 128, 130, and 132, define a unit pixel area or region for one or more photo-sensors or detector structures. In one example, the pixel region 112a may include one DTI structure formed surrounding the one or more photo-sensors or detector structures.

The DTI structures 128, 130, and 132 may be disposed in the region enclosed by the dotted line 108a. The DTI structures 128, 130, and 132 may be filled with dielectric material, such as oxide materials.

The semiconductor substrate 112 may include some DTI structures in a region close or adjacent to the scribe line 104. The semiconductor substrate 112 may include some DTI structures in a region close or adjacent to the periphery or edge of the semiconductor device 102. The outer seal ring region is defined proximate to an edge of the semiconductor substrate 112, e.g., proximate to the dotted line 106b. The outer seal ring region surrounds the inner seal ring region and the pixel array region. The inner seal ring region is defined between the outer seal ring region and the pixel array region and therefore the inner seal ring region surrounds the one or more pixel regions 112a. The inner and outer seal ring regions may each include a seal ring structure formed therein as a stress relief structure, a crack stopper, and/or as a moisture/contaminant barrier to protect the active device region, such as the pixel regions 112a in the pixel array region.

As shown in FIG. 2, the outer seal ring region may include one or more DTI structures, for example, DTI structures 118, 120, 122, 124, and 126. Each DTI structure surrounds the pixel array region and extends from a surface of the semiconductor substrate 112 a distance into the semiconductor substrate 112. Each DTI structure is filled with dielectric materials to further buffer or relief the stress encountered during a die singulation or dicing operation. The dielectric materials may include but is not limited to oxide or dielectric materials having a dielectric constant greater than 3.9.

The DTI structures 118, 120, 122, 124, and 126 in the outer seal ring region may be formed at the same time as the formation of the DTI structures 128, 130, and 132 in the pixel array region. The spacing between each of the DTI structures 118, 120, 122, 124, and 126 in the outer seal ring region may be the same as the spacing between each of the DTI structures 128, 130, and 132 in the pixel array region.

In one example, the outer seal ring region of the semiconductor substrate 112 may include one DTI structure e.g., DTI structure 118. The DTI structure 118 may enclose or surround the region enclosed by dotted line 106a. The DTI structure 118 may enclose or surround the region enclosed by dotted line 108a. The DTI structure 118 may be filled with dielectric materials, such as oxide materials. The DTI structure 118 may enclose or surround the pixel array region. The DTI structure 118 may surround the DTI structure 128. The DTI structure 118 may enclose or surround the DTI structure 130. The DTI structure 118 may enclose or surround the DTI structure 132.

In one example, the outer seal ring region of the semiconductor substrate 112 may further include DTI structures 120, 122, 124, and 126. Each of the DTI structures 120, 122, 124, and 126 may be filled with dielectric materials. The DTI structure 120 may surround the DTI structure 118. The DTI structure 122 can surround the DTI structure 120. The DTI structure 124 can surround the DTI structure 122. The DTI structure 126 can surround the DTI structure 124. Put another way, the DTI structure 118 may be enclosed by the DTI structure 120. The DTI structure 120 may be enclosed by the DTI structure 122. The DTI structure 122 may be enclosed by the DTI structure 124. The DTI structure 124 may be enclosed by the DTI structure 126.

The scribe line 104 or scribe region 104 can be devoid of any DTI structure.

Although only the DTI structures 118, 120, 122, 124, 126, 128, 130 and 132 are illustrated in FIG. 2, however, it is contemplated that the outer seal ring region of the semiconductor substrate 112 can include more or less DTI structures in accordance with some other embodiments of the present disclosure. It is appreciated by those skilled in the art that even though there are five illustrated DTI structures between the dotted line 106a and the dotted line 106b in the figures, the number of the DTI structures formed in the outer seal ring region may be more or less depend upon the area of the outer seal ring region e.g., the region enclosed between the dotted line 106a and the dotted line 106b, and the spacing or pitch between each of the DTI structures. For example, more DTI structures (having relatively small pitch) may be formed with the region enclosed by dotted line 108a to define pixel regions of a relatively small pitch. For example, more DTI structures having relatively small pitch or spacing can be formed between the dotted line 106a and the dotted line 106b.

Each of the DTI structures 118, 120, 122, 124, 128, 130, and 132 may be surrounded by the DTI structure 126. Each of the DTI structures 118, 120, 122, 128, 130 and 132 may be surrounded by the DTI structure 124. Each of the DTI structures 118, 120, 128, 130 and 132 may be surrounded by the DTI structure 122. Each of the DTI structures 118, 128, 130 and 132 may be surrounded by the DTI structure 120. Each of the DTI structures 128, 130 and 132 may be surrounded by the DTI structure 118.

The DTI structure 126 may be disposed next to the DTI structure 124. The DTI structure 124 may be disposed next to the DTI structure 122. The DTI structure 122 may be disposed next to the DTI structure 120. The DTI structure 120 may be disposed next to the DTI structure 118. The DTI structure 128 may be disposed next to the DTI structure 130. The DTI structure 130 may be disposed next to the DTI structure 132.

The DTI structures 118, 120, 122, 124, and 126 may be laterally equally spaced. In one example, the DTI structures 118, 120, 122, 124, and 126 may be spaced by the same separation between each pixel region 112a e.g., by the same pixel pitch. The DTI structures 118, 120, 122, 124, and 126 may have the same trench width as shown in FIG. 2, however, it is appreciated by those skilled in the art that the DTI structures 118, 120, 122, 124, and 126 may have different trench width based on the desired isolation and stress relief performance.

In one embodiment, the DTI structure 126 may be referred as an outermost DTI structure in the outer seal ring region and the DTI structure 118 may be referred as an innermost DTI structure in the outer seal ring region. The DTI structure 126 may be laterally spaced from the scribe region 104.

Figure 3:
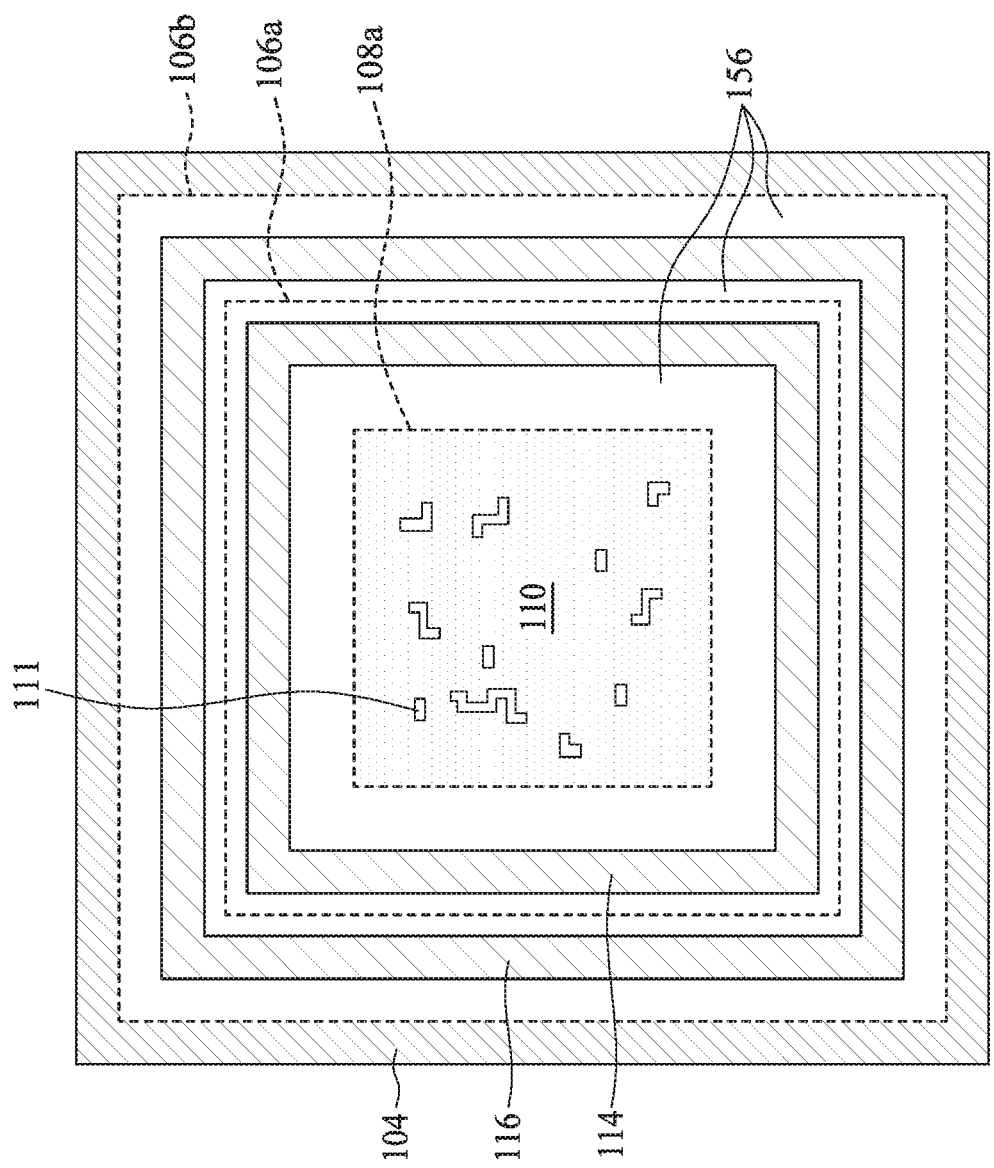
FIG. 3 illustrates an enlarged bottom view of a portion in the dotted box A as shown in FIG. 1 in accordance with some embodiments of the present disclosure.

FIG. 3 illustrates an enlarged bottom view of a portion in the dotted box A as shown in FIG. 1 in accordance with some embodiments of the present disclosure.

Referring to FIG. 3, the semiconductor device 102 (not denoted in FIG. 3) may be formed within the region enclosed by the dotted line 106b.

The semiconductor device 102 may include a region 110. The region 110 may be enclosed by the dotted line 108a. The region 110 may correspond to the pixel array region and may include one or more pixel regions 112a as shown in FIG. 2. The region 110 may further enclosed region that vertically corresponds to the pixel regions 112a as shown in FIG. 2.

The semiconductor device 102 may include an conductive interconnection 111 (e.g. a stacked conductive structure 111 or metal wring 111) formed in the region 110 for providing necessary pixel circuitry connection associated with the one or more pixel regions. In order to avoid obscuring the present invention, only the relevant details on the conductive interconnection 111 are provided.

In one embodiment, the semiconductor device 102 may further include a metal stack 114 or metal ring 114. The metal ring 114 may be disposed close to or adjacent to the region 110. The metal ring 114 may be disposed in the inner seal ring area or the region enclosed by the dotted line 106a. The metal ring 114 can enclose or surround the region 110. The metal ring 114 can enclose or surround the conductive interconnection 111. The metal ring 114 may be referred to as an inner seal ring.

In one embodiment, the semiconductor device 102 may further include a metal stack 116 or metal ring 116. The metal ring 116 may be disposed in a region between the dotted line 106a and the dotted line 106b, i.e., the metal ring 116 may be disposed in the outer seal ring region. The metal ring 116 can enclose or surround the region 110. The metal ring 116 can enclose or surround the conductive interconnection 111. The metal ring 116 can enclose or surround the metal ring 114. The metal ring 116 may be referred to as an outer seal ring.

The metal rings 114 and 116 may be formed from metallic material including but not limited to aluminum, tungsten, copper, or alloy metals. The metal rings 114 and 116 may be included to act as a stress release, a crack stopper, and/or as a moisture/contaminant barrier.

The semiconductor device 102 may include dielectric materials forming one or more dielectric layers 156 referred to as inter-layer dielectric (ILD) layers for separating adjacent metal interconnection layers of metal stacks 114, 116 as well as the conductive interconnection 111.

Figure 4:
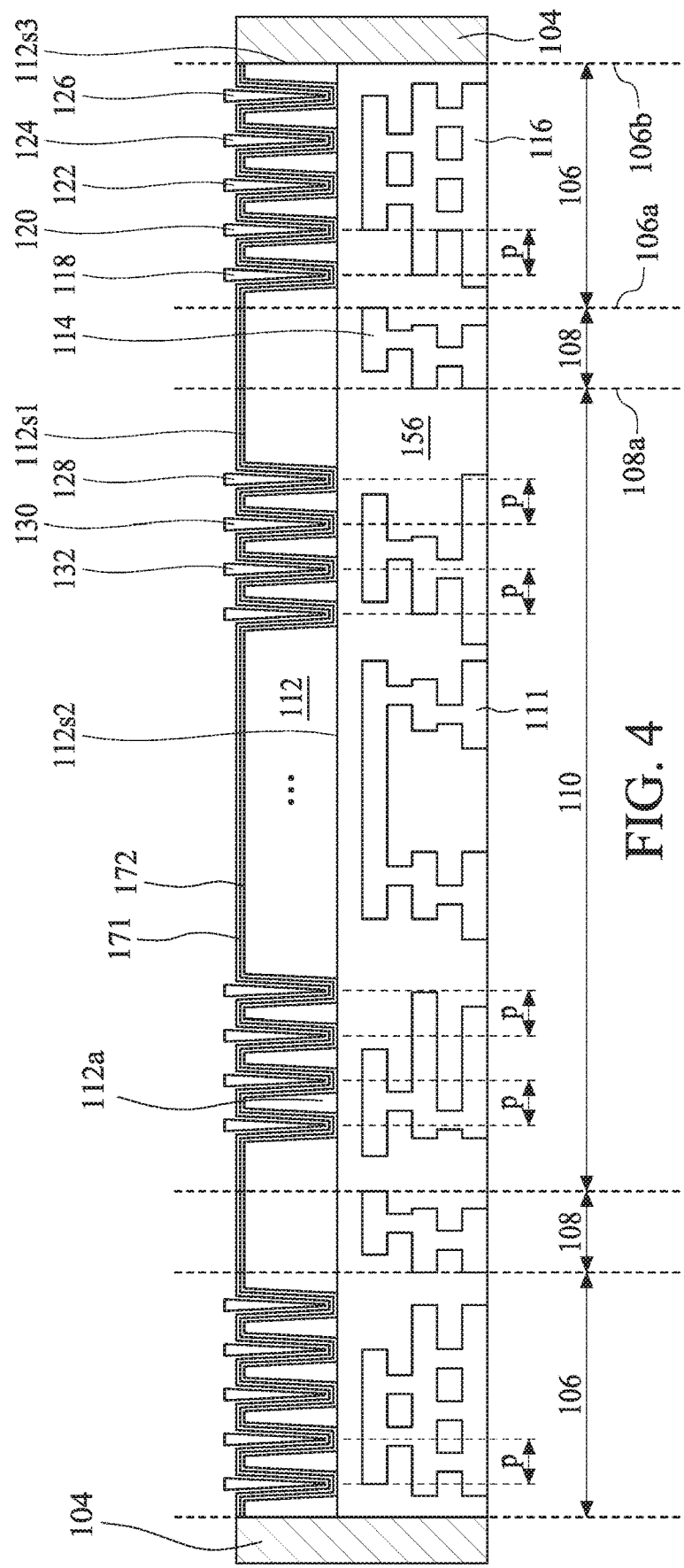
FIG. 4 illustrates a cross-sectional view along the line AA' as shown in FIG. 2 in accordance with some embodiments of the present disclosure.

FIG. 4 illustrates a cross-sectional view along the line A-A' as shown in FIG. 2 in accordance with some embodiments of the present disclosure.

Referring to FIG. 4, the semiconductor device 102, which may be enclosed or surrounded by the scribe lines 104, may include a semiconductor substrate 112. The semiconductor substrate 112 may have a thickness ranged from 4 μm to 10 μm. In one embodiment, the semiconductor substrate 112 may have thickness ranged from 6 μm to 8 μm.

The semiconductor substrate 112 has a first side 112s1 (e.g., a backside), a second side 112s2 (e.g., a front side) opposite to the first side 112s1, and a third side 112s3 that is extended from the first side 112s1 to the second side 112s2. The semiconductor substrate 112 may have an active region 110 (e.g., the pixel array region), a first seal ring region 106 (e.g., the outer seal ring region), and a second seal ring region 108 (e.g., the inner seal ring region). The active region 110 may include one or more pixel regions 112a. Each of the one or more pixel regions 112a may include one or more photo-detectors or photosensitive elements operatively to generate charges in response to incident light from the first side 112s1. The incident light may enter through the first side 112s1 and may be sensed by the one or more photo-detectors in the active region 110. Restated, the one or more photo-detectors formed in the semiconductor substrate 112 may operatively sense or detect the incident light entered through the surface of the first side 112s1. The first side 112s1 may be referred as light receiving side of the semiconductor substrate 112.

The conductive interconnection 111 may be formed within the active region 110. The semiconductor device 102 may include a dielectric layer 156 formed on the second side 112s2. The dielectric layer 156 can be formed by depositing dielectric materials, e.g., oxide material (such as silicon oxide) on a surface of the second side 112s2, for example by chemical vapor deposition process. In some embodiments, the conductive interconnection 111 may be referred as metal interconnections.

The semiconductor device 102 may include conductive interconnections 111 formed on the second side 112s2 of the semiconductor substrate 112 and embedded in the dielectric layer 156. In one embodiment, the semiconductor device 102 may have conductive interconnection 111 surrounded by dielectric materials.

The semiconductor device 102 may include metal stack 114 formed on the second side 112s2 of the of the semiconductor substrate 112 and embedded in the dielectric layer 156. Alternatively, the metal stack 114 may be surrounded by dielectric materials and embedded in the dielectric materials. The metal stack 114 may be, for example, an inner seal ring structure. In one embodiment, the metal stack 114 may serve as a sealing and supporting structure. In another embodiment, the metal stack 114 may be formed to route signals between pixel array circuit and associated peripheral logic circuit.

The semiconductor device 102 may include metal stack 116 formed on the second side 112s2 of the of the semiconductor substrate 112 and embedded in the dielectric layer 156. The metal stack 116 is surrounded by the dielectric materials. The metal stack 116 may be, for example, an outer seal ring structure.

The metal stack 114 may be formed within the second seal ring region 108. The metal stack 116 can be formed within the first seal ring region 106. In one embodiment, a distance between the dotted line 106a and the dotted line 106b may range from approximately 4 μm to approximately 12 μm. In one embodiment, a distance between the dotted line 106a and the dotted line 106b may range from approximately 6 μm to approximately 10 μm.

The conductive interconnection 111 may be disposed on the second side 112s2 of the semiconductor substrate 112. The metal stack 114 formed in the dielectric layer 156 may be disposed on the second side 112s2 of the semiconductor substrate 112. The metal stack 116 formed in the dielectric layer 156 may be disposed adjacent to the second side 112s2 of the semiconductor substrate 112. The metal stack 114 and the metal stack 116 formed above the surface of the second side 112s2 of the semiconductor substrate 112 may be vertically or elevationally separated from the surface of the second side 112s2 of the semiconductor substrate 112 by the dielectric layer 156. A part of the dielectric layer 156 is disposed or interposed between the metal stack 114 and each of the DTI structures 118, 120, 122, 124, and 126. A part of the dielectric layer 156 is disposed or interposed between the metal stack 116 and each of the DTI structures 118, 120, 122, 124, and 126.

The conductive interconnection 111 may include multiple conductive interconnection layers with the dielectric layer 156 separate adjacent conductive interconnection layers. The dielectric layer 156 further separates the adjacent metal interconnection layers of the metal stacks 114 and 116.

The metal stack 116 may be disposed in adjacent to an edge or an periphery of the semiconductor substrate 112. The edge or periphery of the semiconductor substrate 112 may also be the edge or periphery of the semiconductor device 102. The metal stack 116 may surround the metal stack 114. The metal stack 116 may enclose the metal stack 114. The metal stack 116 may be laterally spaced from the metal stack 114. The metal stack 116 may be horizontally spaced from the metal stack 114.

In the embodiment of FIG. 4, the dielectric layer 156 is a single dielectric layer, but without depart from the scope of the present disclosure, the dielectric layer 156 may be multi-dielectric layer structure, such as three or four dielectric layer stack structure. Each of the metal stack 114 and metal stack 116 in FIG. 4 includes three metal interconnection layers, but other embodiments, each of the metal stack 114 and metal stack 116 may include more or less metal interconnection layers depend upon the requirements of the inner and outer seal ring structure for semiconductor device 102.

The semiconductor substrate 112 may have DTI structures 118, 120, 122, 124, 126, 128, 130, and 132 formed thereon.

In view from the first side 112s1 of the semiconductor substrate 112, the DTI structures 118, 120, 122, 124, 126 may be formed vertically above the metal stack 116. Specifically, the DTI structure 118 may be formed above the metal stack 116. The DTI structure 118 may align vertically the metal stack 116. The DTI structure 120 may be formed above the metal stack 116. The DTI structure 122 may be formed above the metal stack 116. The DTI structure 124 may be formed above the metal stack 116. The DTI structure 126 may be formed above the metal stack 116. The DTI structure 118 may be formed in the first seal ring region 106. The DTI structure 120 may be formed in the first seal ring region 106. The DTI structure 122 may be formed in the first seal ring region 106. The DTI structure 124 may be formed in the first seal ring region 106. The DTI structure 126 may be formed in the first seal ring region 106.

The DTI structure 118 may vertically correspond to the metal stack 116. The DTI structure 120 may vertically correspond to the metal stack 116. The DTI structure 122 may vertically correspond to the metal stack 116. The DTI structure 124 may vertically correspond to the metal stack 116. The DTI structure 126 may vertically or correspond to the metal stack 116. In a plane view, the DTI structures 118, 120, 122, 124, 126 may be overlapped with the metal stack 116. The DTI structures 118, 120, 122, 124, 126 and the metal stack 116 are formed in different layers and thus not in contact with the metal stack 116, i.e., there exits a first vertical space in between the DTI structures 118, 120, 122, 124, 126 and the metal stack 116. The first vertical distance between each of the DTI structures 118, 120, 122, 124, 126 and the metal stack 116 can range between 3000 Å to 4000 Å.

In one embodiment, the metal stack 116 and each of DTI structures 118, 120, 122, 124, 126 is vertically separated by at least an inter-layer dielectric layer, such as the dielectric layer 156. In other words, each of DTI structures 118, 120, 122, 124, 126 may landed on the inter-layer dielectric layer and not in contact with the metal stack 116.

It is worth to note that by having the first distance disposed between the DTI structures 118, 120, 122, 124, 126 and the metal stack 116 formed in the first seal ring region (e.g., the outer seal ring region), the DTI structures 118, 120, 122, 124, 126 may not need not to be vertical or laterally aligned with the metal stack 116. In other words, the spacing between DTI structures 118, 120, 122, 124, 126 and the associated trench width can be configured with more flexibility. For example, the spacing and the trench width associated with DTI structures 118, 120, 122, 124, 126 may be configured based on the stress relief or processing needs.

Additionally, the DTI structures 118, 120, 122, 124, 126 disposed in the first seal ring region and the DTI structures 128, 130, 132 disposed in the active region 110 may be formed in the same process i.e., form at the same time with same mask as the DTI structures 118, 120, 122, 124, 126 can be configured to have the same trench characteristics (e.g., same trench depth, same trench width, or same trench pitch) as the DTI structures 128, 130, 132. As such, no additional process may be needed to form the DTI structures 118, 120, 122, 124, 126.

In the perspective view of FIG. 4, the DTI structure(s) may be formed on a surface of the first side 112s1 (e.g., backside) of the semiconductor substrate 112 and extend from the surface of the first side 112s1 into semiconductor substrate 112. The DTI structure(s) in the inner seal ring region 108 may be formed above or on the metal stack 114 with a second vertical distance in accordance with some other embodiments of the present disclosure. Similarly, the second vertical distance between the DTI structures in the inner seal ring region and the metal stack 114 can range between 3000 Å to 4000 Å. In one embodiment, the second vertical distance may be the same as the first vertical distance. In other embodiments, the second vertical distance may be different from the first vertical distance. In one embodiment, the DTI structure(s) may be formed vertically aligned with the metal stack 114. Although it is not illustrated in FIG. 4, the semiconductor substrate 112 can include DTI structure(s) in the second seal ring region 108 in accordance with some other embodiments of the present disclosure.

Each of the DTI structures 118, 120, 122, 124, 126, 128, 130, and 132 may be laterally or horizontally spaced apart from another. Any of the DTI structures (e.g. the DTI structures 118, 120, 122, 124 and 126) may be laterally or horizontally spaced apart from the scribe region 104. In other words, the scribe region 104 may be devoid of any DTI structure.

In one embodiment, the DTI structure 126 may be referred as an outermost DTI structure in the first seal ring region 106 and the DTI structure 118 may be referred as an innermost DTI structure in the first seal ring region 106. The DTI structure 126 may be laterally spaced from the scribe region 104.

The DTI structures 118, 120, 122, 124, 126, 128, 130, and 132 may be laterally spaced apart by a pitch P, which may be ranged from approximately 0.8 µm to approximately 2.5 µm. It is contemplated that the pitch P may be varied or changed of interest, e.g., based on the pixel pitch between pixel regions 112a, in accordance with some other embodiments of the present disclosure. Although the DTI structures 118, 120, 122, 124, 126, 128, 130, and 132 illustrated in FIG. 4 may have the same pitch P, it is contemplated that distance between every two adjacent DTI structures may not have to be the same. For example, the distance between the DTI structure 126 and the DTI structure 124 may be different from the distance between the DTI structure 122 and the DTI structure 124. For example, the distance between the DTI structure 126 and the DTI structure 124 may be different from the distance between the DTI structure 130 and the DTI structure 132.

An aspect ratio of the DTI structure (e.g. the DTI structure 118, 120, 122, 124, or 126) formed in the first seal ring region 106 may be substantially the same as an aspect ratio of the DTI structure (e.g. the DTI structure 128, 130, or 132) in the region 110. In one embodiments, the DTI structure (e.g. the DTI structure 118, 120, 122, 124, or 126) formed in the first seal ring region 106 may be vertically aligned with the metal stack (or the first seal ring structure) 116.

In one embodiment, the DTI structure (e.g. DTI structure 118, 120, 122, 124, 126, 128, 130, or 132) may have an aspect ratio (i.e., the ration between trench depth and trench width) range from 10 to 30.

In some embodiments, dielectric layers 171 and 172 may be formed on the first side 112s1 of the semiconductor substrate 112. Dielectric layers 171 and 172 may be deposited on the first side 112s1 by chemical vapor deposition (CVD), atomic vapor deposition (AVD), physical vapor deposition (PVD). The dielectric layers 171 and 172 may be silicon oxide or dielectric materials with a dielectric constant greater than 3.9 or high-k dielectric materials, including but not limited to hafnium dioxide ($HfO_2$), aluminum oxide ($Al_2O_3$), zirconium dioxide ($ZrO_2$), and titanium dioxide ($TiO_2$).

In some embodiments, the dielectric layers 171 and 172 may be formed of same dielectric material.

In some embodiments, the dielectric layers 171 and 172 may be formed of different dielectric material. For example, the dielectric layer 172 may be formed of high-k dielectric material and the dielectric layer may be formed of silicon oxide.

In some embodiments, the same dielectric material may be arranged or deposited in the DTI structures 118, 120, 122, 124, 126, 128, 130, and 132 as well as along the first side 112s1 of the semiconductor substrate 112.

In other embodiments, the dielectric material deposited in the DTI structures 118, 120, 122, 124, 126 of the first seal ring region 106 and the DTI structures of the second seal ring region 108 may be different from the dielectric material deposited in the DTI structures 128, 130, and 132 of the active region 110. For example, the dielectric materials deposited in the DTI structures 118, 120, 122, 124, 126 of the first seal ring region 106 and the DTI structures of the second seal ring region 108 may be silicon oxide and the dielectric materials deposited in the DTI structures 128, 130, and 132 may be include a layer of high-k dielectric material and a layer of silicon oxide.

In some other embodiments, although not illustrated in FIG. 4, the present disclosure may provide a semiconductor device which is similar to the semiconductor device 102 as illustrated and described with reference to FIG. 4, except that the DTI structures 118, 120, 122, 124, 126 of the first seal ring region 106 shown in FIG. 4 may be replaced by a seal ring support structure. The seal ring support structure can be in contact with the metal stack 116.

In order to provide a solid support of the metal stack 116, the seal ring support structure may have to be relatively, precisely aligned with the metal stack 116. Accordingly, manufacture of the seal ring support structures may require relatively great cost in aligning opening(s) to form the seal ring support structure with the metal stack 116 to secure a relatively effective contact between the seal ring support structure the metal stack 116.

Moreover, the seal ring support structure may have material(s) different from the DTI structures as shown in FIG. 4. Therefore, the seal ring support structure has to be formed in a processing stage different from (e.g. prior to or subsequent to) the processing stage of manufacturing the DTI structures as shown in FIG. 4. Accordingly, the seal ring support structure may have characteristics different from the DTI structures as shown in FIG. 4.

Figure 5:
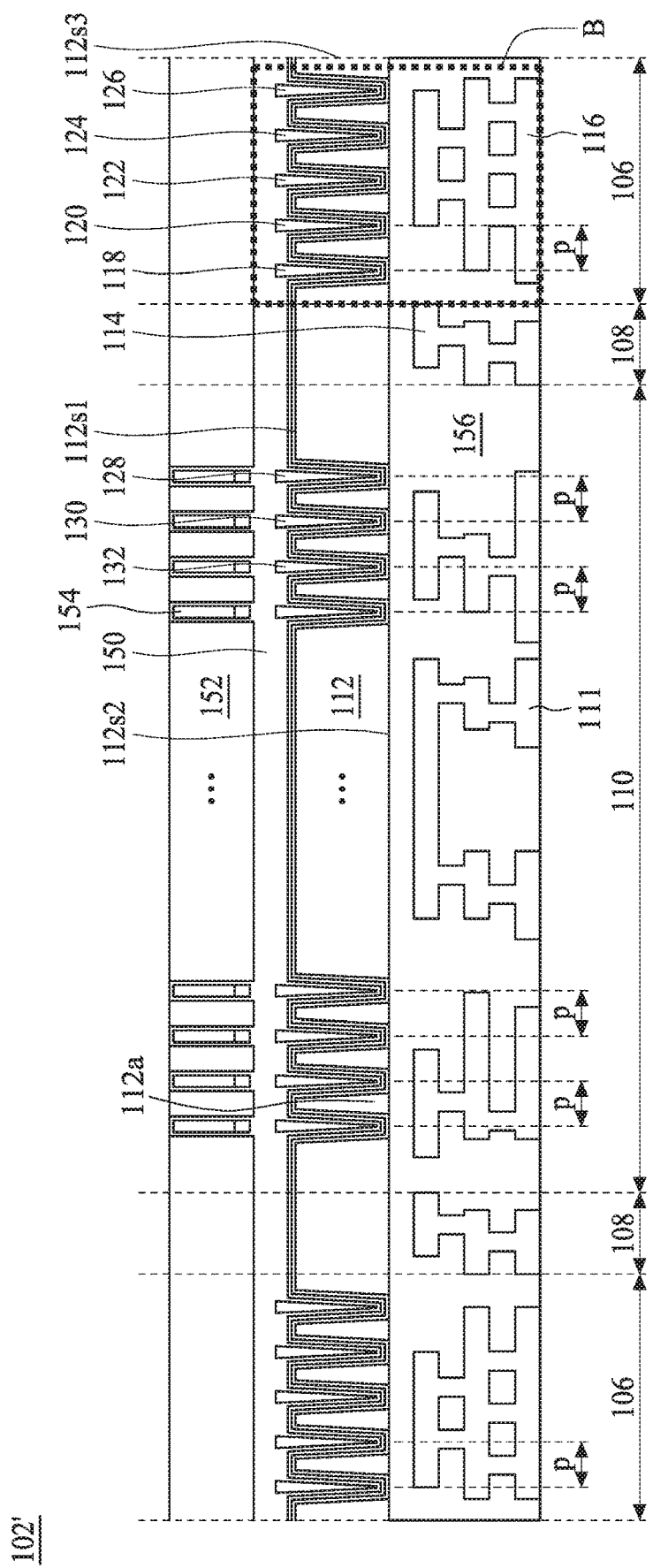
FIG. 5 illustrates a cross-sectional view of a semiconductor device in accordance with some embodiments of the present disclosure.

FIG. 5 illustrates a cross-sectional view of a semiconductor device 102' in accordance with some embodiments of the present disclosure.

The semiconductor device 102' is similar to the semiconductor device 102 as illustrated and described with reference to FIG. 4, thus for brevity, detailed descriptions of identical portions are omitted. The semiconductor device 102' is different from the semiconductor device 102 in that the semiconductor device 102' further include a layer 150 on the surface of the first side 112s1 of the semiconductor substrate 112 and a layer 152 on the layer 150. The semiconductor device 102 may further include some light blocking structure(s) 154 formed in the layer 152.

The layer 150 may include, for example but is not limited to, a buffer layer and/or a planarization layer. The layer 152 may include, for example but is not limited to, a color filter array. The color filter array includes a plurality of color filters and the color filters may be arranged according to Bayer pattern. The layer 152 may further include a plurality of light blocking structures 154 (such as metal grid structures) formed therein. The light blocking structures 154 may be formed in between color filters.

In some embodiments, the light blocking structures 154 function to prevent optical crosstalk between adjacent pixels by absorption, reflection and refraction. In some embodiments, the light blocking structures 154 function to block or reflect light reflected by the layer 150. In some embodiments, the light blocking structures 154 may include aluminum, tungsten or the combination thereof. In some embodiments, the light blocking structures 154 may include dielectric materials having a low index of refraction, such as oxides. In some embodiments, the light blocking structures 154 may include a combination of dielectric and metallic materials.

In some embodiments, the semiconductor device 102' further include an array of microlens having a plurality of microlenses formed on top of the first side 112s1 of the semiconductor substrate 112. In some embodiments, the array of microlens may be formed above the color filters in the region 110. In some embodiments, the plurality of microlenses may be disposed or positioned corresponding to the pixel regions 112a. In some embodiments, the plurality of microlenses focus incident light to the respective pixel regions 112a.

Figure 6:
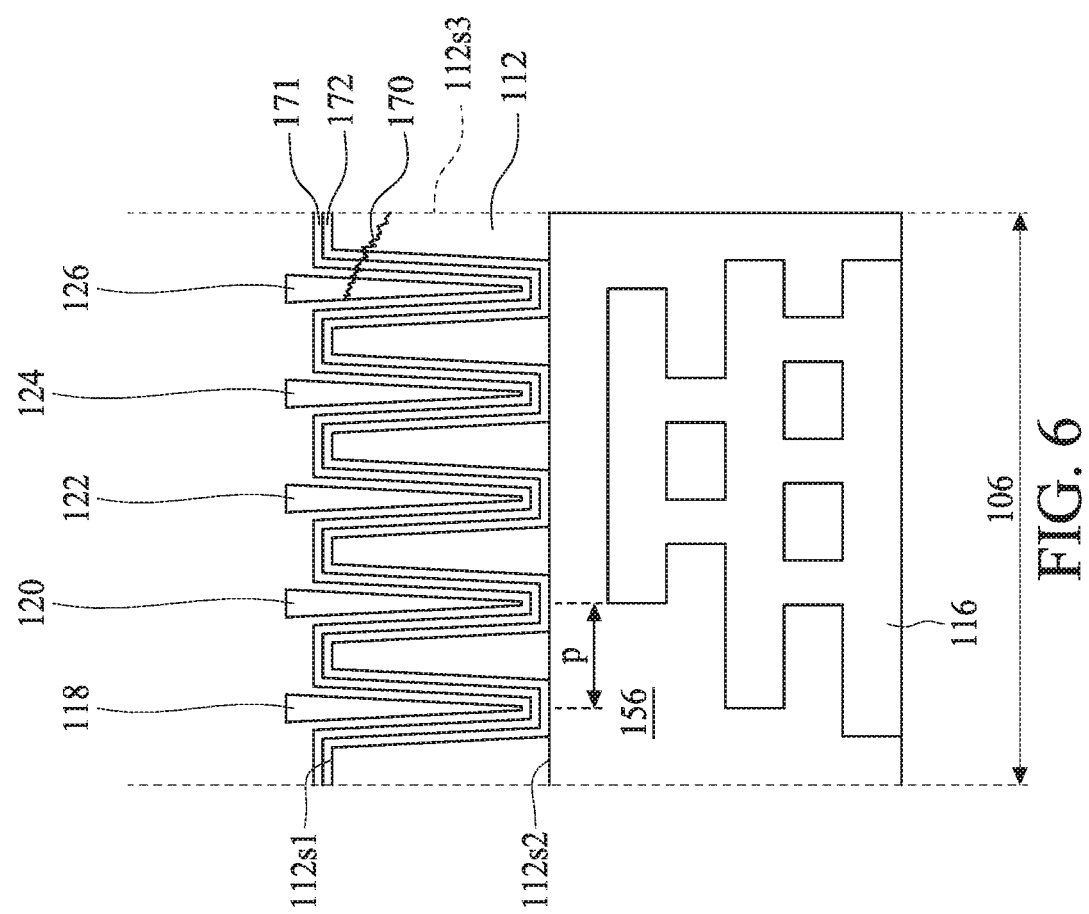
FIG. 6 illustrates an enlarged view of the structure in dotted box B as shown in FIG. 5 in accordance with some embodiments of the present disclosure.

FIG. 6 illustrates an enlarged view of the structure in dotted box B as shown in FIG. 5 in accordance with some embodiments of the present disclosure.

Some semiconductor devices 102' as shown in FIG. 5 can be formed after performing a dicing or singulation operation on the semiconductor wafer 100 along the scribe lines 104 as shown in FIG. 1.

During the singulation operation, crack or damage (which may be caused by, for example but is not limited to stress (mechanical stress, thermal stress, etc.) may propagate from the scribe region 104 as shown in FIG. 4 to the semiconductor device 102'.

An outer seal ring (such as the metal stack 116) may protect the region (e.g. the conductive interconnection, the dielectric material or other structure) surrounded by seal ring from damage or crack during the singulation operation.

A DTI structure (e.g. the DTI structure 118, 120, 122, 124 or 126) may function as a reinforced wall to stop, mitigate, alleviate or minimize the crack or damage propagation during the singulation operation.

For example, referring to FIG. 6, after the singulation or dicing operation, a crack or damage 170 may be observed in the semiconductor substrate 112, which could be relatively fragile. The crack 170 may propagate to the DTI structure 126, through the dielectric layers 171 and 172. Propagation of the crack 170 may stop in or at the DTI structure 126. In other words, the DTI structure 126 can stop, mitigate, alleviate or minimize the crack propagation. Although it is not illustrated in FIG. 6, it is contemplated that the crack 170 may be observed at the DTI structure 124. Although it is not illustrated in FIG. 6, it is contemplated that the crack 170 may be observed at the DTI structure 122. Although it is not illustrated in FIG. 6, it is contemplated that the crack 170 may be observed at the DTI structure 120. Although it is not illustrated in FIG. 6, it is contemplated that the crack 170 may be observed at the DTI structure 118.

The third side 112s3 may have a surface roughness relatively greater than a surface roughness of the first side 112s1 or the second side 112s2. As the third side 112s3 may be formed after the dicing or singulation operation of the semiconductor wafer 100.

FIGS. 7A-7E illustrate operations of manufacturing a semiconductor device at various stages in accordance with some embodiments of the present disclosure.

Figure 7A:
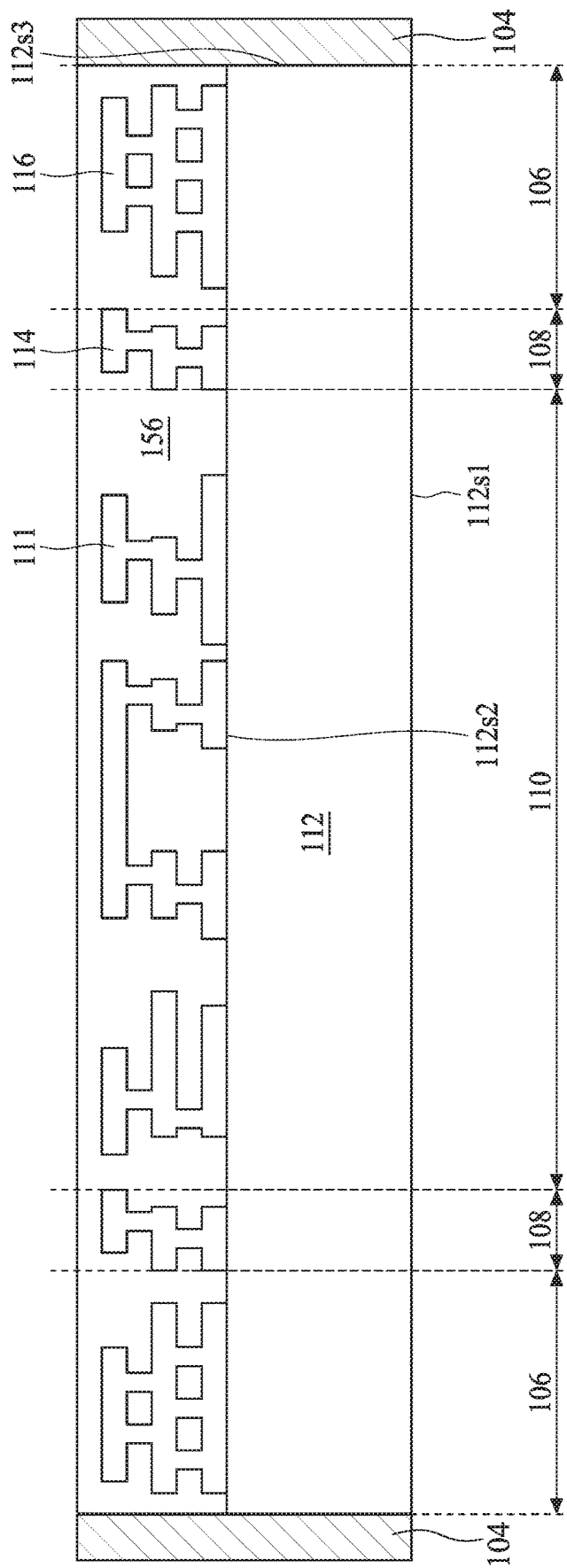
FIGS. 7A-7E illustrate operations of manufacturing a semiconductor device at various stages in accordance with some embodiments of the present disclosure.

Referring to FIG. 7A, a semiconductor wafer 100 may be provided. The semiconductor wafer 100 may include a semiconductor substrate 112.

A dielectric layer 156 may be formed on a surface of a second side 112s2 of the semiconductor substrate 112. In one embodiment, dielectric layer 156 may be formed by depositing a layer of dielectric on the surface of the second side 112s2 of the semiconductor substrate 112. In another embodiment, dielectric layer 156 may be formed by depositing a plurality of layers of dielectric on the second side 112s2 of the semiconductor substrate 112.

A conductive interconnection 111 can be formed on the second side 112s2 of the semiconductor substrate 112 and embedded in the dielectric layer 156. A metal stack 114 can be formed on the second side 112s2 of the semiconductor substrate 112. A metal stack 116 can be formed on the surface of the second side 112s2 of the semiconductor substrate 112. The conductive interconnection 111, metal stack 114 and metal stack 116 may be formed in a same process.

Figure 7B:
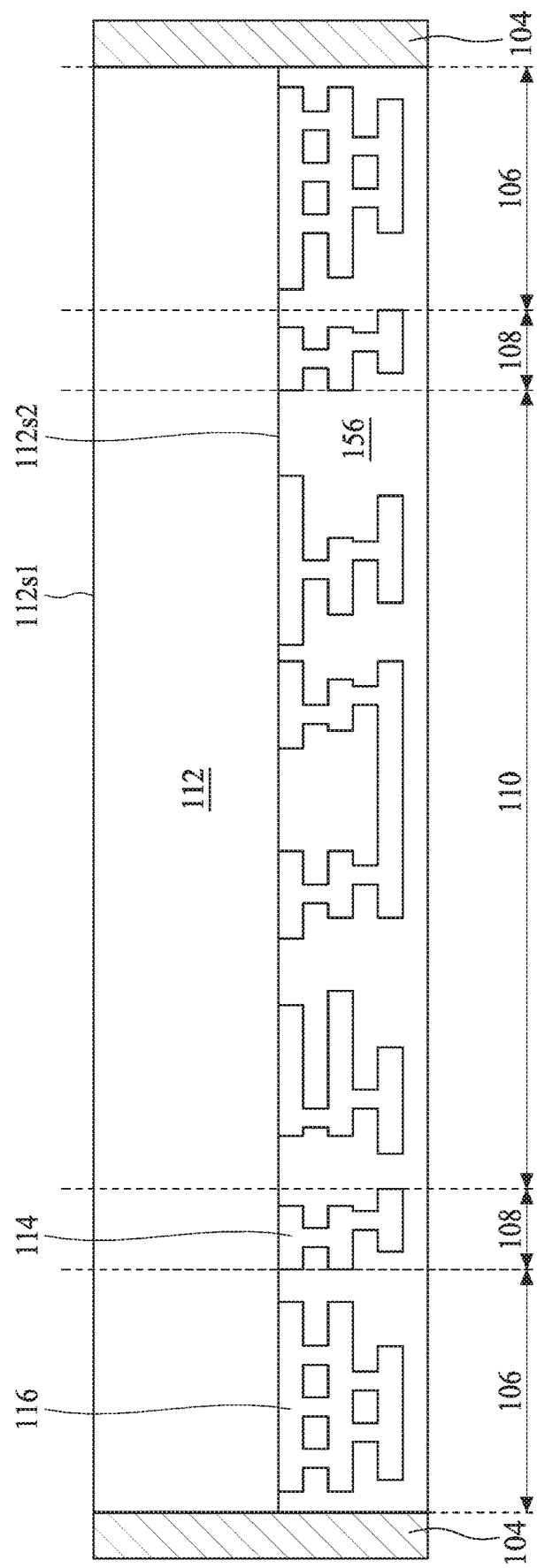

Referring to FIG. 7B, the structure as shown in FIG. 7A can be turned or moved upside-down, with the first side 112s1 facing upward and the second side 112s2 facing downward.

Figure 7C:
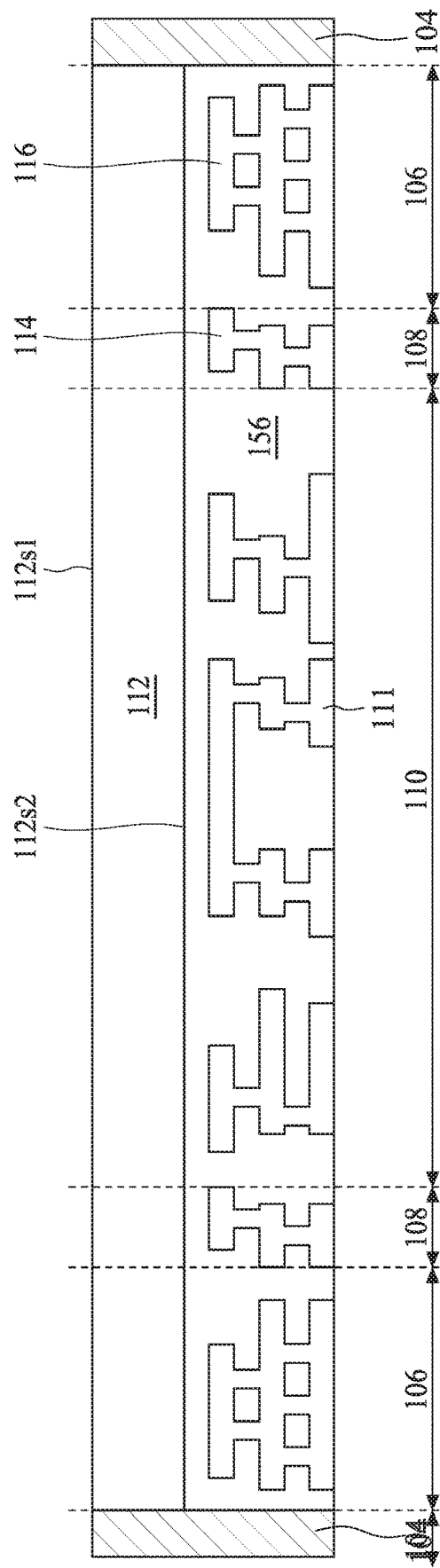

Referring to FIG. 7C, optionally, a thinning operation, for example a chemical polishing or planarization process, may be performed to the second side 11s2 of the semiconductor substrate 112. A thinning operation may be performed on the dielectric layer 156 to expose the conductive interconnection 111. A thinning operation may be performed on the dielectric layer 156 to expose the metal stack 114. A thinning operation may be performed on the dielectric layer 156 to expose the metal stack 116.

Figure 7D:
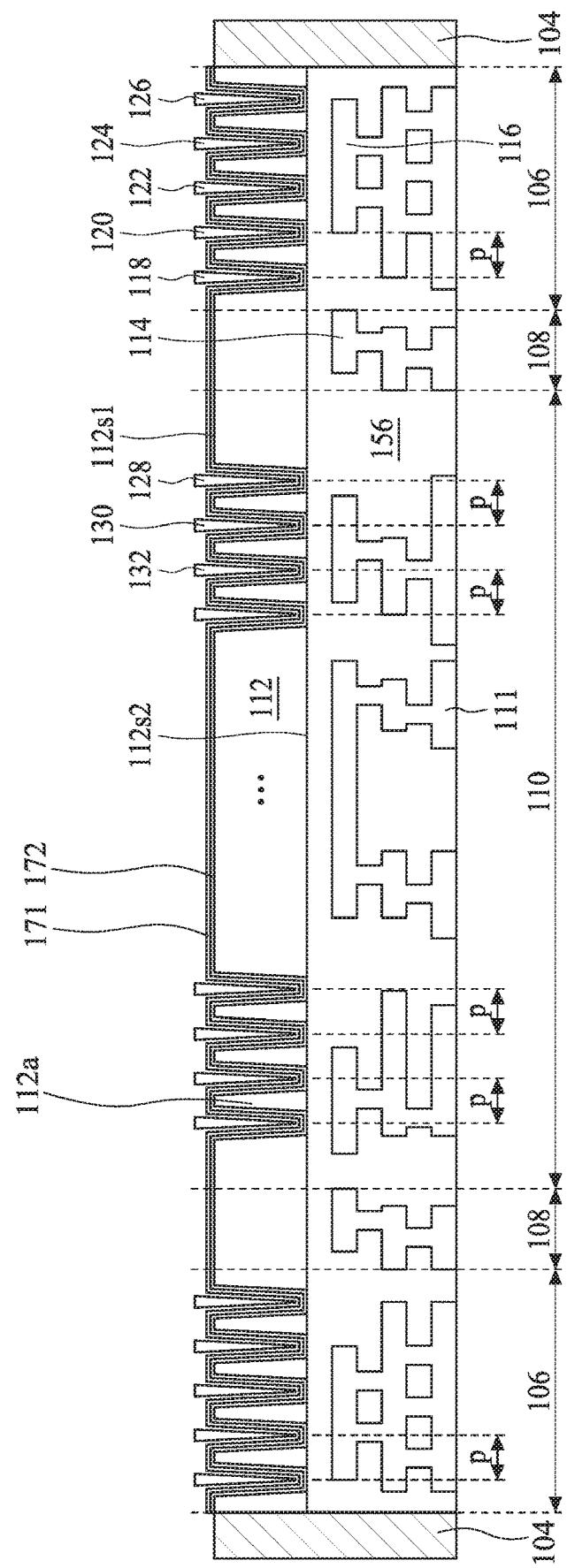

Referring to FIG. 7D, a plurality of DTI structures (e.g. DTI structures 118, 120, 122, 124, 126, 128, 130, and 132) may be formed extending from the first side 112s1 into the semiconductor substrate 112. For example, the first side 112s1 of the semiconductor substrate 112 may be patterned and etched to form the plurality of DTI structures. The DTI structures 118, 120, 122, 124, and 126 may be formed from the first side 112s1 of the semiconductor substrate 112 to correspond to the metal stack 116. The DTI structures (e.g. the DTI structures 118, 120, 122, 124, 126, 128, 130, and 132) may be formed in a single operation.

The DTI structure(s) may be formed in the region 106. The DTI structure(s) may be formed in the region 108 in accordance with some other embodiments of the present disclosure. The DTI structure(s) may be formed in the region 110. No DTI structure(s) is formed in the scribe region 104.

The DTI structures (such as the DTI structures 118, 120, 122, 124, 126, 128, 130, and/or 132) may be formed by etching the first side 112s1 of the semiconductor substrate 112 through a mask to form a plurality of openings (or trenches); diffusing dopants in the openings; forming dielectric layers (e.g. dielectric layers 171 and 172) in the openings (or trenches); filling the openings with dielectric materials; removing some dielectric materials.

The DTI structures 118, 120, 122, 124, 126 disposed in the first seal ring region and the DTI structures 128, 130, 132 disposed in the active region 110 may be formed in a same process as discussed above (e.g. a mask can be used to pattern and etch a plurality of trenches to form the DTI structures as shown in FIG. 7D) such that each of the DTI structures 118, 120, 122, 124, 126, 128, 130 and 132 may have the same trench characteristics (e.g., same trench depth, same trench width, or same trench pitch) to another.

In one embodiment, the formation the dielectric layer 156, conductive interconnection 111, and the metal stacks 114, 116 illustrated in FIG. 7A-7C may occur prior to the formation the plurality of the DTI structures. For example, the processes for forming the dielectric layer 156 with the conductive interconnection 111 and the metal stacks 114, 116 arranged within the dielectric layer 156 on the second side 112s2 (e.g., the front side or non-light-receiving side) of the semiconductor substrate 112 may be performed first. Afterwards, the semiconductor substrate 112 may be turned around to form the plurality of the DTI structures formed on the first side 112s1 (e.g., the backside or light-receiving side).

In one embodiment, the one or more photo-detectors 112a formed in the semiconductor substrate 112 may be formed before the formation of the dielectric layer 156, conductive interconnection 111, and the metal stacks 114, 116. In order to not obscuring the present invention, details on forming the one or more photo-detectors 112a are omitted as the process of forming the photo-detectors are well-known and also not the focus of the present invention.

Figure 7E:
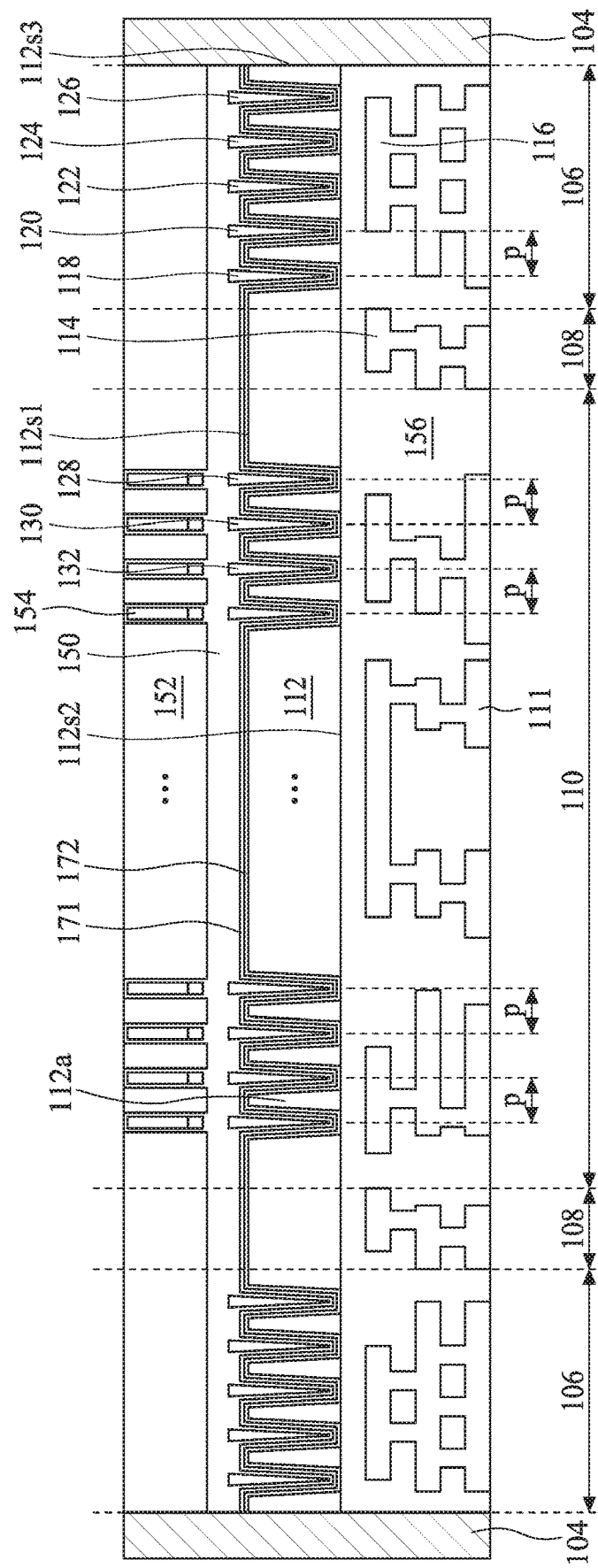

Referring to FIG. 7E, the layers 150 and 152, and the light blocking structures 154 are formed on the first side 112s1 of the semiconductor substrate 112. light blocking structures 154 Then, a dicing or singulation operation may be performed to for some semiconductor device 102' as shown in the FIG. 5.

The dicing or singulation operations may be performed along the scribe line region 104.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to ta given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
   a semiconductor substrate having a pixel array region and a first seal ring region, wherein the first seal ring region is proximate to an edge of the semiconductor substrate and surrounds the pixel array region, wherein the first seal ring region includes a first seal ring;
   a first deep trench isolation (DTI) structure filled with a dielectric material formed on the semiconductor substrate, the first DTI structure being disposed in the first seal ring region and extended into the semiconductor substrate, wherein the first DTI structure is a continuous trench structure surrounding the pixel array region; and a second DTI structure filled with the dielectric material and the second DTI being disposed in the first seal ring region and between the first DTI structure and the pixel array region, wherein the second DTI structure is a continuous trench structure surrounding the pixel array region.

2. The semiconductor device of claim 1, wherein the first seal ring is vertically separated from the first DTI structure by a vertical distance.

3. The semiconductor device of claim 2, wherein the first seal ring and the first DTI structure are separated by a dielectric layer.

4. The semiconductor device of claim 1, wherein the second DTI structure is surrounded by the first DTI structure and laterally spaced from the first DTI structure.

5. The semiconductor device of claim 4, wherein the semiconductor substrate having a first side and a second side opposite to the first side, the DTI structure having an opening formed on the first side of the semiconductor substrate and the first seal ring is formed on the second side of the semiconductor substrate.

6. The semiconductor device of claim 4, wherein the pixel array region includes a pixel array comprising of a plurality of pixels, the plurality of pixels are spaced by a pixel pitch, the first DTI structure is laterally spaced from the second DTI structure by the pixel pitch.

7. The semiconductor device of claim 1, wherein the dielectric material includes oxide material.

8. The semiconductor device of claim 1, wherein the dielectric material comprises a material having a dielectric constant greater than 3.9.

9. The semiconductor device of claim 1, wherein the second DTI structure is enclosed by the first DTI structure.

10. The semiconductor device of claim 1, wherein the first DTI structure has a crack.

11. A semiconductor wafer, comprising:
at least a semiconductor device formed on the semiconductor wafer, the semiconductor device comprising:

a semiconductor substrate having a pixel array region and a first seal ring region, wherein the first seal ring region is proximate to an edge of the semiconductor substrate and surrounds the pixel array region; and a plurality of first deep trench isolation (DTI) structures disposed in the first seal region, each of first DTI structures being filled with a dielectric material and extended into the semiconductor substrate, wherein each of the plurality of first DTI structures is a continuous trench structure disposed to surround the pixel array region; and a scribe region disposed adjacent to the edge of the semiconductor device and being configured to surround the semiconductor device;

wherein the semiconductor substrate comprises a second seal ring region between the pixel array region and the first seal ring region, wherein the second seal ring region has a second seal ring disposed therein surrounding the pixel array region.

12. The semiconductor wafer of claim 11, wherein the plurality of first DTI structure comprises an outermost first DTI structure configured to surround the other first DTI structures and the outermost first DTI structure being laterally spaced from the scribe region.

13. The semiconductor wafer of claim 11, further comprising:
a first seal ring, formed in the first seal ring region, the first seal ring disposed proximate to the edge of the semiconductor substrate, and being vertically separated from the plurality of first DTI structures by a vertical distance.

14. The semiconductor wafer of claim 13, wherein the first seal ring and the plurality of the first DTI structures are separated by a dielectric layer.

15. The semiconductor wafer of claim 11, wherein the dielectric material includes oxide material.

16. The semiconductor device of claim 1, wherein the semiconductor substrate comprises a second seal ring region between the pixel array region and the first seal ring region, wherein the second seal ring region has a second seal ring disposed therein surrounding the pixel array region.

* * * * *